United States Patent [19]
Goodman et al.

[11] Patent Number: 5,904,781
[45] Date of Patent: May 18, 1999

[54] PROCESSING AND APPARATUS FOR MANUFACTURING AUTO-COLLIMATING PHOSPHORS

[76] Inventors: Claude Goodman, 2996 Dellwood Dr., Lake Oswego, Oreg. 97034; Alan Lyon, 1325 La Loma, Berkeley, Calif. 94708; Daniel Wildermuth, 2527-A N. Hayden Island Dr., Portland, Oreg. 97217

[21] Appl. No.: 08/880,226

[22] Filed: Jun. 23, 1997

[51] Int. Cl.[6] .................................................. C23C 14/00
[52] U.S. Cl. ........................................................ 118/726
[58] Field of Search ............................................. 118/726

[56] References Cited

U.S. PATENT DOCUMENTS

| | | | |
|---|---|---|---|
| 4,069,355 | 1/1978 | Lubowski | 427/70 |
| 4,528,210 | 7/1985 | Noji | 427/70 |
| 4,842,894 | 6/1989 | Ligtenberg | 427/70 |
| 5,171,996 | 12/1992 | Perez-Mendez | 250/361 R |
| 5,427,817 | 6/1995 | Goodman | 427/69 |

*Primary Examiner*—Richard Bueker
*Attorney, Agent, or Firm*—Louis E. Marn

[57] ABSTRACT

There is described a process and apparatus for the physical vapor deposition of an anisotropic phosphor composition with an auto-collimating, optical waveguide structure.

10 Claims, 3 Drawing Sheets

PROCESSING AND APPARATUS FOR MANUFACTURING AUTO-COLLIMATING PHOSPHORS

REFERENCES CITED

U.S. Patent Documents

| | | |
|---|---|---|
| 4,069,355 | 1/1978 | Lubowski et al. |
| 4,528,210 | 7/1985 | Noji et al. |
| 4,842,894 | 6/1989 | Ligtenberg et al. |
| 5,171,996 | 12/1992 | Perez-Mendez |
| 5,427,817 | 6/1985 | Goodman et al. |

PCT Documents

| | | |
|---|---|---|
| PCT/US94/08357 | 7/1994 | Goodman et al. |

BACKGROUND OF THE INVENTION

1. Field of the Invention

The present invention relates to anisotropic phosphor deposition technology, and more particularly to a method and apparatus for manufacturing an auto-collimating phosphor imaging screen.

2. Brief Description of the Prior Art

In U.S. Pat. No. 4,069,355 to Lubowski et al., there is described a process for forming a phosphor screen on a patterned substrate using wide-angled vapor deposition (as in a hot-wall evaporator) so as to deposit the phosphor only on the raised portions of the substrate.

In U.S. Pat. No. 4,528,210 to Noji et al., there is described a process for sequentially depositing a multilayer input phosphor screen on a substantially smooth substrate so that individual columnar crystals of the second layer of alkali halide grow vertically upon the crystal particles of the first layer, standing close together with fine spaces therebetween [sic]. A third layer is preferably deposited on the second layer as a continuous film. These three layers can be deposited by evaporating a phosphor material or materials at a prescribed temperature and degree of vacuum.

In U.S. Pat. No. 4,842,894 to Ligtenberg et al., there is described a method of manufacturing an x-ray image intensifier tube wherein a vapor deposition crucible is provided between forty and fifty degrees from the central normal to a smooth surface of a screen on which luminescent material is to be deposited. During deposition the vapor deposition source performs a circular movement about the surface to produce a layer having a regular structure and a good fill factor.

In U.S. Pat. No. 5,171,996 to Perez-Mendez, there is described a method for fabricating a particle detector of a sequence of columns of regular, controllable geometry and diameter perpendicular to the interface of luminescent material with adjacent materials wherein the columns are separated by gaps which may be evacuated or filled with air, with a light-absorbing material, or with a light-producing or light-reflective substance.

In U.S. Pat. No. 5,427,817 to Goodman et al., there is described a process for the vapor deposition of a scintillator phosphor composition with concomitant shadowing wherein the substrate is rotated through an arc relative to the vapor source of said phosphor, whereby shadowing introduces voided gaps or interstices between columns as a result of the preferential components receiving more coating flux, particularly in the presence of an oblique flux. In the present invention the limitations of the past due to the mandrel substrate fixture, in the size and quantity of applicable substrates, have been eliminated by a system scale-up that required the development of a novel, computer controlled, multi-constituent, evaporation source. Furthermore, the precise monitoring and control over material feed-rates and multiple temperature zones achieved with this source provide the means to produce more complex phosphors, as will be described in the following objects and detailed description of the invention.

While the processes of the prior art have achieved certain levels of performance, there is a desire to optimize the performance of structured, auto-collimating phosphors to achieve high ionizing radiation to quantum energy conversion efficiency and high spatial resolution.

OBJECTS OF THE PRESENT INVENTION

Conventional thin film deposition techniques involve changing of the surface properties of substrate materials to impart advantageous characteristics, e.g., a corrosion-resistant coating. Successful surface modification depends on the deposition of a continuous, defect-free coating layer. Conversely, an effective auto-collimating phosphor layer must be replete with uniform structural discontinuities.

An object of the present invention is to provide a process for forming an anisotropic, auto-collimating phosphor of high ionizing radiation to luminescent energy conversion efficiency with concomitant high spatial resolution.

Another object of the present invention is to provide a method for depositing an optical wave-guiding structured layer, consisting of columns and interstices of controllable geometry, to optically decouple the luminescent columns while retaining a high fill factor.

A further object of the present invention is to provide a well controlled, hence reproducible, economical method for producing a structured, auto-collimating phosphor with enhanced detector spatial resolution and energy conversion efficiency.

A further object of the present invention is to provide a physical vapor evaporation source that is able to control the evaporation rates of the constituents of complex phosphor compositions, while maintaining fixed ratios of those constituents in the vapor phase and resultant condensed phosphor layer.

A further object of the present invention is the ability of said source to evaporate very large amounts of material without reloading, which is ideal for load-locked production systems.

A further object of the present invention is the achievement of very high deposition rates for long periods of time, which is necessary for depositing thick layers of phosphors over large area substrates.

A further object is for said source to work in an inert environment, from high vacuum to many torr of pressure, because high operating pressure results in the preferential columnar deposition profile necessary to achieve the auto-collimating function.

A still further object of the present invention is to provide a method of depositing phosphor layers directly upon passivated photodetectors such as charge coupled devices, photodiode arrays, etc., by means and under conditions that do not damage the photodetectors.

A still further object of the present invention is to provide a method of depositing phosphor layers upon fiber optic elements such as face plates and light pipes so that excellent optical coupling is achieved without the occurrence of visible artifacts such as moire interference patterns.

Still another object of the present invention is to provide a method of depositing phosphor layers on supportive substrates to produce image intensifying and storage phosphor screens.

SUMMARY OF THE INVENTION

A physical vapor deposition system consisting of a suitable vacuum chamber fitted with the instrumentation, process sensors and metrology necessary to effect the deposition of a layer of phosphor complex with controlled anisotropic structure and dopant profile.

DETAILED DESCRIPTION OF THE INVENTION

Figure 1:
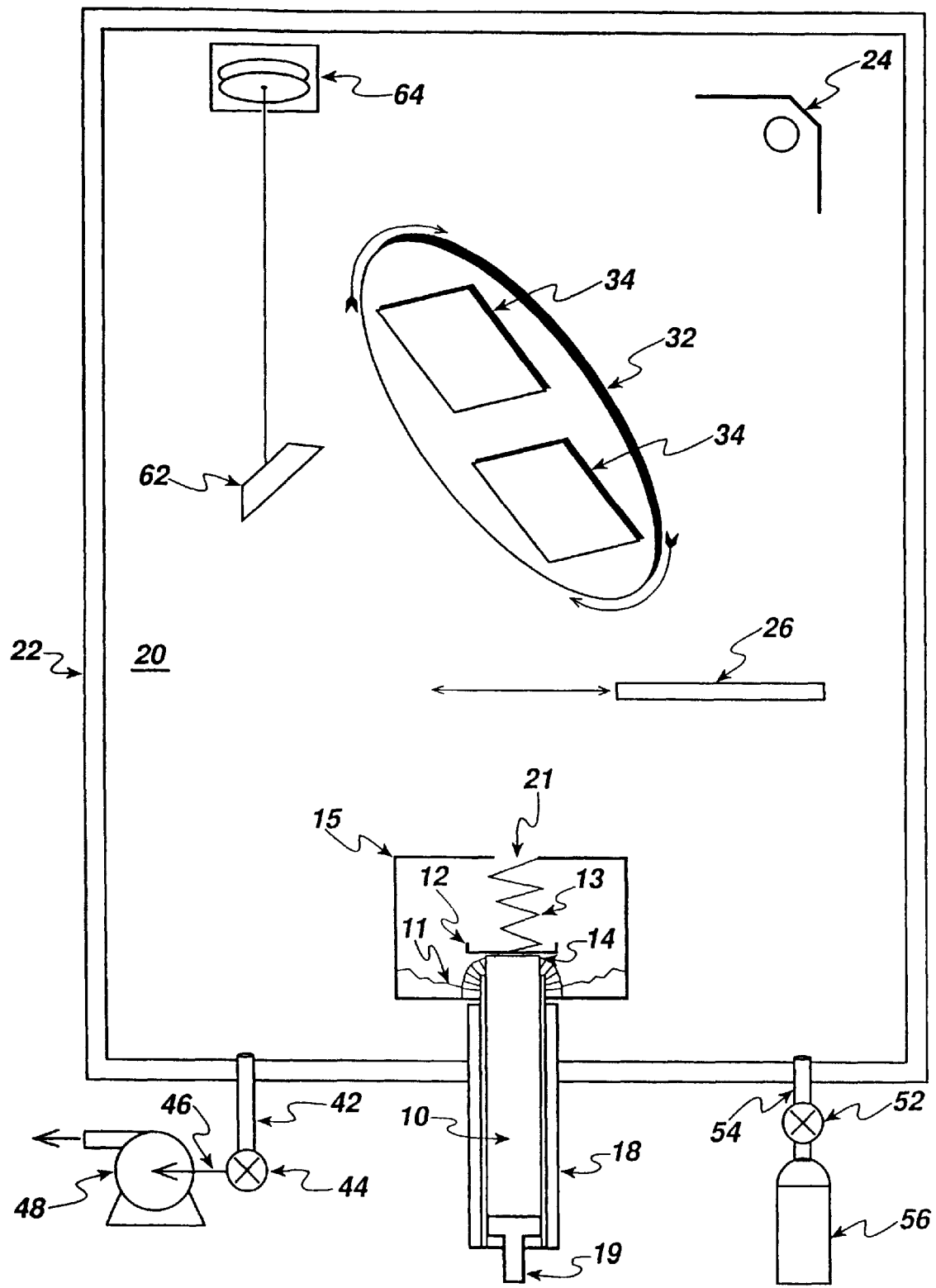
FIG. 1 is a schematic elevational sectional view of the vapor deposition apparatus of the present invention.

Referring now to FIG. 1, there is illustrated a vacuum evaporator, generally indicated as 22 comprised of inner wall members defining interior vacuum chamber 20. The vacuum chamber 20 is outfitted with pumps 48, valves 44, and conduits 42 and 46 in fluid communication with said chamber to effect a vacuum in the range of about $10^{-6}$ to $10^{-2}$ torr. The pumps 48 are selected to minimize hydrocarbon backstreaming into the chamber, and liquid nitrogen traps (not shown) are employed to remove water from the chamber, contaminants known to adversely affect the performance of some phosphors. Means are also provided to introduce into said chamber feedstocks 10 via feed tubes 18, and gases 56 via valves 52, and conduits 54 in fluid communication with said chamber.

The instrumentation includes a multiple source phosphor constituents evaporator 15 and a substrate fixture 32 to be described in further detail.

The multiple source evaporator 15, preferentially coaxial, is ingot 10 fed via the feed tube 18 and plunger 19. The multiple source evaporator 15 is bulk loaded with phosphor constituents 11. Said evaporator is fashioned from materials that are inert to, and can withstand the high temperatures required to vaporize, said phosphor constituents. Differential heating of the bulk phosphor constituents 11 and ingot 10 is accomplished by resistance heating of the evaporator 15 and internal spring 13 loaded ingot heater 12 by passing electric currents through those conductive elements of said evaporator. By these means a constant ingot pool height 14 may be maintained that, in turn, maintains the desired composition of the phosphor constituents. Baffles are provided (not shown) to control spitting, as known to those skilled in the art. A shutter 26 is provided to control the deposition cycle time.

The substrate fixture 32 is designed to effect motion of the substrates relative to the evaporator, such that the substrates 34 are positioned at preferably oblique angles with respect to said evaporator's vapor exit ports 21. Motion, preferably cyclical or oscillatory, between said substrates and said vapor exit ports improves uniformity of the coating thickness. The desired motion is accomplished by the use of a motor driven turntable or planetary substrate fixture 32, depending on the quantity and size of substrates 34 to be coated. A radiant heater 24 preheats said substrate fixture 32 and substrates 34.

Figure 2:
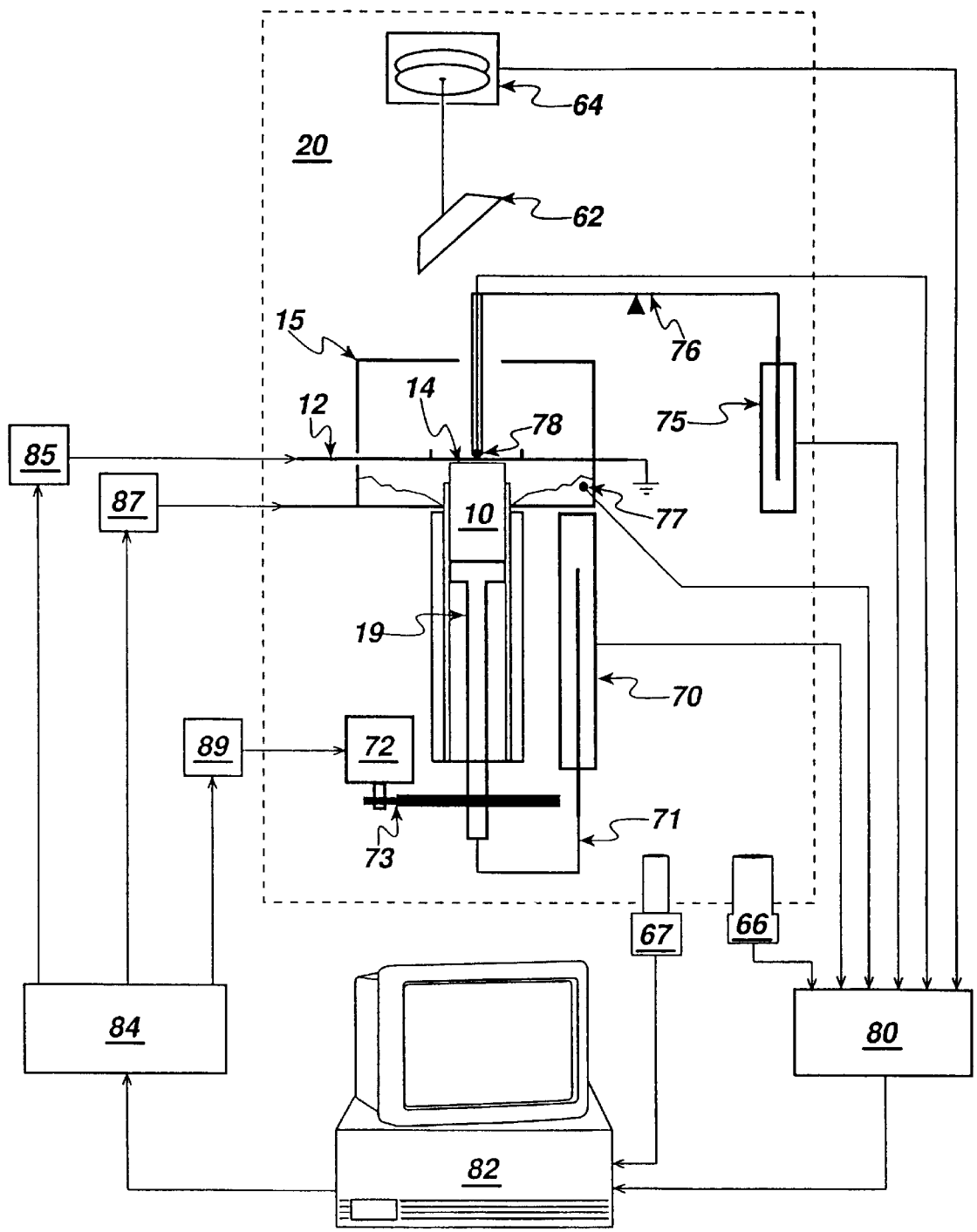
FIG. 2 is a schematic representation of the novel physical vapor evaporation source and its associated sensors and feedback control subsystem.

Referring now to FIG. 2 there is depicted a schematic representation of the novel physical vapor evaporation source 15 and its associated sensors and feedback control subsystem. The internal process sensors include a novel integrating rate monitor consisting of an electromagnetic force coil 64 that is mechanically coupled to a vapor collection element 62. The material feed rate sensor 70 and molten ingot pool height sensor 75 consisting of linear variable differential transformers are mechanically coupled to the ingot plunger 19 by linkage 71 and the ingot heater 12 by lever 76, respectively. The molten ingot pool height sensor 75 can resolve positional changes with micron precision. A motor 72 with gear reduction 73 drives the ingot plunger 19 and ingot 10 into the evaporator. Also implemented are thermocouple probes 77 and 78 that measure the evaporator's bulk and ingot temperatures respectively. Convectron gauge 66 and residual gas analyzer 67 measure the total pressure and constituent gaseous species' concentrations within the vacuum chamber.

External to the vacuum chamber 20 is connected a multichannel analog-to-digital converter (ADC) 80 and computer 82 to monitor the internal process sensors. The ADC 80 multiplexes and transmits the sensor data to the computer 82, where a feedback control algorithm processes the sensor data to generate digital control signals, as is discussed below. The digital control signals are translated by digital-to-analog converter block 84 into control voltages to set the outputs of the bulk heater power supply 85, the ingot heater power supply 87, and the ingot drive motor power supply 89. Thus, the computer performs real-time adjustments and corrections of the critical process parameters via closed-loop feedback control. By these means, a constant molten ingot pool height 14 is maintained by the computer-based control of the ingot feed motor 72 driving the ingot 10. The system uses a feedback control loop based on the deviation of molten ingot pool height sensor 75, coupled to the top of ingot heater 12, from the desired setpoint, to adjust the voltage to the ingot feed motor 72, driving ingot plunger 19, and ingot 10 into the evaporator 15.

At steady state operation said ingot feed motor is running at approximately constant voltage to provide a constant rate of flow of material into said evaporator. The control algorithm is designed to reach this ideal voltage quickly while remaining responsive to changes in said molten ingot pool height. Every sample period, said heater position sensor is measured. The current value is compared to the operator specified setpoint to compute the current error:

$\epsilon_i$=Current Value−Setpoint where $\epsilon_i$ is the error term for this, interval i. The previous error value, $\epsilon_{i-1}$, is used to compute the change in error. Finally, two constants are used to weight each of these two error terms and the result added to the current voltage setting:

$M_i = M_{i-1} + C_1\epsilon_i + C_2(\epsilon_i - \epsilon_{i-1})$ where $M_i$ is the voltage used to control said motor during this interval i, and $C_1$ and $C_2$ are the empirically determined control constants. $C_1$ weighs the importance of the current error when correcting the motor voltage. The larger the error, the farther that the current motor speed is from its ideal voltage, and the greater the correction required. However, if this constant is too large, the system will oscillate excessively. $C_2$ weight the importance of the change in the error (the differential term). This serves two functions. As a stable voltage is approached, it helps slow down the change and prevent overshoot. Once stability is reached, it helps respond to changes that introduce new error more quickly. However, if the value is too large, the system will take too long to reach stability. If the value is too small, the system will take too long to recover when conditions change.

Figure 3:
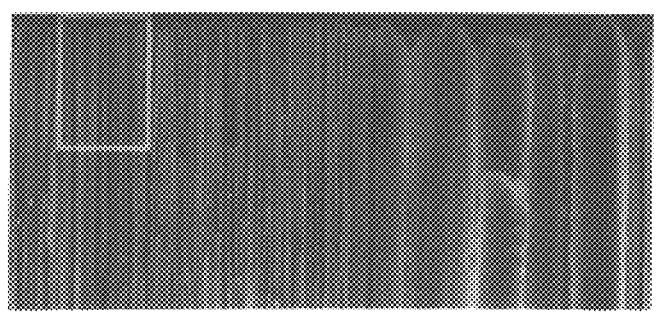
FIG. 3 is a scanning electron micrograph cross-sectional view of an auto-collimating, anisotropic phosphor layer, showing the voided gaps or interstices between phosphor columns that form the optical wave guide structure.
Figure 4:
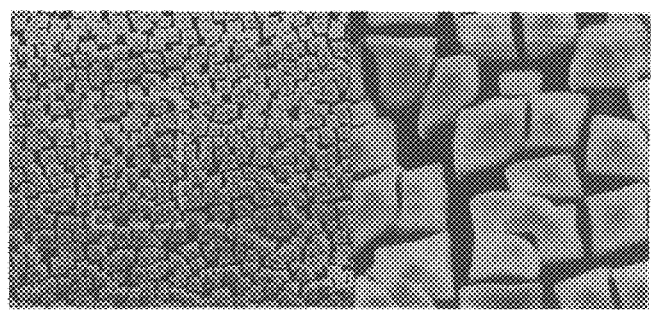
FIG. 4 is a scanning electron micrograph superficial view of an anisotropic phosphor layer, showing the tops of the phosphor columns separated by voided gaps or interstices that form the optical wave guide structure.

By these means, precise control of the evaporation rates of said phosphor constituents may be accomplished to achieve the desired dopant profiles of the activating constituents, or in-situ activated phosphor synthesis, which results in high performance phosphors that do not require post-deposition annealing for high light output. Thus is the deposition of an auto-collimating layer of activated phosphor with controlled anisotropic structure, as depicted in SEMs FIG. 3 and FIG. 4 accomplished.

Figure 5:
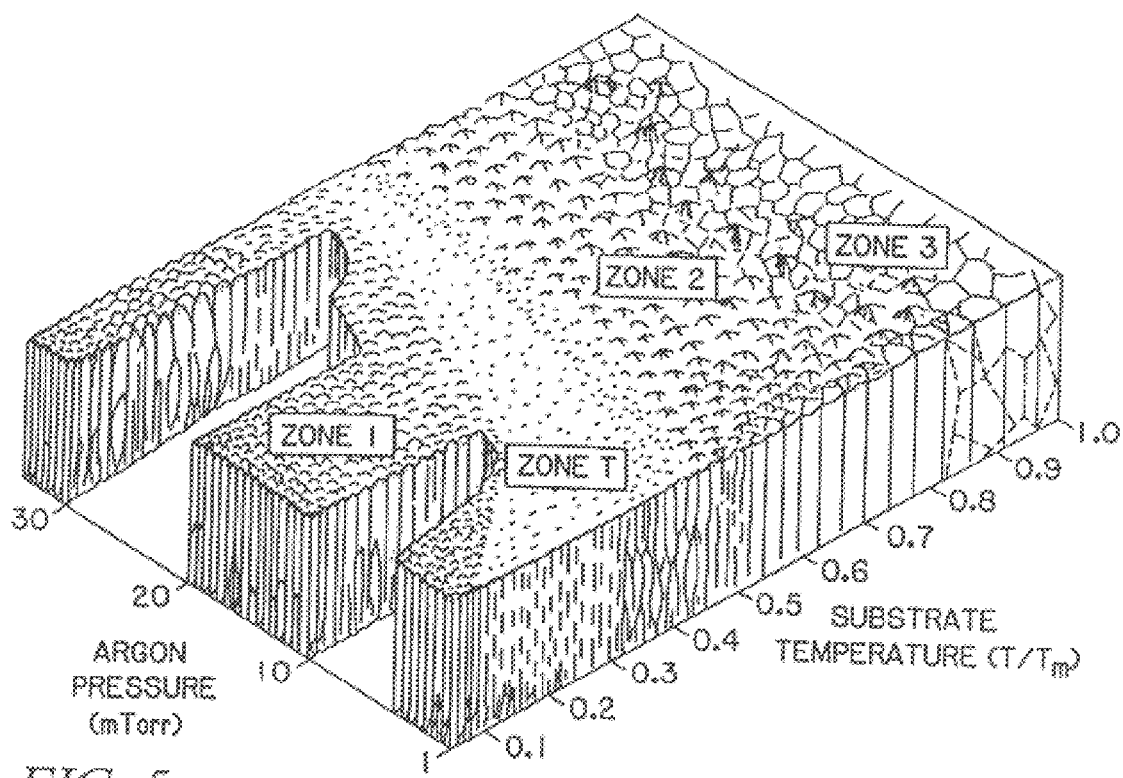
FIG. 5 is a Movchan-Demchishin structure zone diagram.

The growth of the anisotropic polycrystalline microstructure of the thus formed phosphor layer is augmented by the proper selection of the substrate deposition temperature and vacuum chamber working pressure as illustrated by the Movchan-Demchishin diagram, FIG. 5 depicting structural zones in vacuum condensates as a function of the ratio of the absolute deposition temperature (T) to the melting point ($T_m$) of the components for a two component system. For such systems, realizable ratios of $T/T_m$ between 0.3 and 0.6 place the deposited structure in the transition zone, Zone T, between Zone 1 (flared columns separated by voided boundaries) and Zone 2 (columnar grains with dense inter crystalline boundaries). Inert gases, such as Argon, may be present at a pressure of from 1 to 50 milli-torr permitting Zone 1 structures for $T/T_m$ ratios in the range of from 0.3 equal to or less than $T/T_m$ equal to or less than 0.6.

The advantage of said multiple source phosphor constituents evaporator over conventional evaporators is the ability to evaporate complex phosphors while holding all their constituent concentrations constant. It is ideal for load-locked production systems because very large amounts of material can be evaporated without reloading. High deposition rates can be achieved for long periods of time, which is advantageous for manufacturing thick layers over large substrate areas. Said evaporator performs predictably with chamber pressures from high vacuum to many torr. The addition of inert gases is advantageous for depositing auto-collimating phosphors because, as pressure in the chamber is increased, there is more scattering of the evaporated atoms. Optimization of the deposition and scattering angles by positioning of the substrates and adjustment of the pressure, respectively, determine the formation of the anisotropic structure and auto-collimating properties of the deposited phosphor layers. Two examples are provided to illustrate the versatility of this design.

EXAMPLES

Preparation of an auto-collimating scintillator imaging screen

Thallium doped Cesium Iodide (CsI:Tl) is an efficient scintillator when the dopant concentration is about 0.2 mole percent Thallium. However the Thallium Iodide phosphor constituent has a much higher vapor pressure than the Cesium Iodide phosphor constituent. An ingot-fed flash-evaporation mode of operation is used to maintain the correct percentage of Thallium from the pre-formed ingot to the vapor deposited scintillator layer.

The CsI and TlI ingot is fed through a water cooled tube into the evaporation boat. Tantalum metal is used to construct the evaporator boat heating elements since it is inert to the hot phosphor constituents. Upon entering the boat the ingot encounters a tantalum heater element located in the boat 2 mm above the water cooled feed tube. The heater melts the CsI ingot and evaporates the TlI. The TlI evaporates from a small molten pool in contact with the internal heater. The TlI diffuses through the hot CsI into the CsI pool and is evaporated, leaving a TlI depleted zone at the top of the ingot. The melted CsI flows from the heater to the hotter boat cavity and is evaporated. The set points for evaporation are: 660° C. for the boat and 585° C. for the heater. Since the TlI ingot component has a sublimation temperature of about 250° C., it is effectively flash evaporated by maintaining the ingot heater at 585° C. When the system is in steady state evaporation the ingot feed rate is about 1 mm/min. The boat and the heater temperatures can be increased to increase deposition rate and the computer controlled feed rate will increase to maintain steady state evaporation at the fixed stoichiometry.

A deposition rate of about 2 microns per minute, substrate preheated temperature of 100° C. and rotation rate of about 60 RPM, and an Argon pressure of 3 mtorr are achieved to fabricate an optimal scintillator layer. The vacuum chamber is pumped down to 1 $\mu$torr, then back filled with Argon to 3 mtorr.

The evaporation boat temperature and ingot feed rate are adjusted such that the rate monitor registers a deposition rate equivalent to 2 microns per minute on the substrate surface. The shutter is opened for a time sufficient to deposit a layer of phosphor of the thickness desired to achieve the desired performance. For example, if a 100 $\mu$m thick phosphor layer is desired, the process run time will be 50 minutes at a deposition rate of 2 microns per minute. By these means, anisotropic scintillator screens may be readily deposited that do not require post-annealing to achieve maximum light output.

Preparation of an auto-collimating storage phosphor imaging screen

Europium doped Barium Fluorobromide (BaFBr:Eu) is an efficient electron trapping storage phosphor when the dopant concentration is about 0.1 mole percent Europium. However the Europium Fluoride phosphor constituent has a much lower vapor pressure than the Barium Fluorobromide phosphor constituent. A modified ingot-fed flash-evaporation mode of operation is used to accomplish in-situ reaction of a stoechiometric mixture of dehydrated Barium Bromide with Barium Fluoride to form the desired alkyl-halide, BaFBr. The $BaBr_2.2H_2O$ feedstock must be completely dehydrated in vacuum at 150° C. for one day prior to use to prevent oxihalide formation that would otherwise diminish the phosphor's efficiency. Activation of the BaFBr with the correct concentration of dopant $Eu^{2+}$ is accomplished by bulk coevaporation of Europium Fluoride using the independent bulk heater monitoring and controlling means. Steady state operation insures a uniform Europium dopant concentration throughout the thus deposited phosphor layer.

The $BaBr_2$ and $BaFl_2$ ingot is fed through a water cooled tube into the evaporation boat. Molybdenum metal is used to construct the evaporator boat heating elements since it is inert to the hot phosphor constituents. The vacuum chamber is pumped down to 1 $\mu$torr, then back filled with Argon to 5 mtorr. Initially, the boat temperature is brought up to about 950° C. and adjusted until the desired $EuFl_2$ evaporation rate is achieved. Ingot containing a stoechiometric mixture of $BaBr_2$ and $BaFl_2$ is then fed into the evaporation boat while holding the heater position constant. Upon entering the boat the $BaBr_2$ and $BaFl_2$ ingot encounters a Molybdenum heater located in the boat at 2 mm above the water cooled ingot feed tube. The heater melts, vaporizes and reacts the ingot constituents to form gaseous BaFBr at a rate controlled by the ingot feed rate and the ingot heater temperature. When the system is in steady state evaporation the ingot heater is about of 860° C. and the ingot feed rate is about 1 mm/min. The evaporation boat temperature and ingot feed rate are adjusted such that the rate monitor registers a deposition rate equivalent to 2 microns per minute on the substrate surface. The substrate is preheated to 160° C. and rotated at about 60 RPM. The shutter is opened for a time sufficient to deposit a layer of phosphor of the thickness desired to achieve the desired performance. For example, if a 150 $\mu$m thick phosphor layer is desired, the process run time will be 75 minutes at a deposition rate of 2 microns per minute. By these means, anisotropic storage phosphor screens may be readily deposited.

While the present invention has been described in connection with exemplary embodiments thereof, it will be understood that many modifications in the apparatus and phosphor constituents will be apparent to those of ordinary skill in the art, and that this application is intended to cover any adaptations or variations thereof. Therefore, it is manifestly intended that this invention be only limited by the claims and the equivalents thereof.

We claim:

1. An apparatus for forming an anisotropic imaging screen from two or more phosphor constituents, comprising:
   a) a differential heating, multiple phosphor constituents evaporator;
   b) a plurality of heaters having independently controllable power supplies;
   c) an evaporator feed rate monitor;
   d) a molten ingot pool height monitor;
   e) a molten ingot pool temperature sensor;
   f) one or more precision rate controlled ingot feeders;
   g) independently controllable power supplies for said ingot feeders;
   h) one or more reservoir temperature sensors; and
   i) an evaporator deposition-rate monitor.

2. An apparatus according to claim 1 in which said ingot feeders deliver phosphor constituent materials into said evaporator.

3. An apparatus according to claim 1 in which said multiple phosphor constituents evaporator incorporates one or more reservoirs.

4. An apparatus according to claim 3 in which said reservoirs receive bulk loads of phosphor constituent materials.

5. An apparatus according to claim 1 in which said evaporator feed-rate monitor comprises ingot position detection means.

6. An apparatus according to claim 1 in which said ingot position detection means provide a feedback control signal to modulate the ingot feed rate.

7. An apparatus according to claim 1 in which said ingot position detection means provide a feedback control signal to modulate the ingot heater power, independent of the bulk heater power.

8. An apparatus according to claim 1 in which said evaporator deposition-rate monitor comprises an electromagnetic force coil coupled to a phosphor vapor collection means.

9. An apparatus according to claim 1 in which said process is performed via computer assisted monitors and controls.

10. An apparatus according to claim 9 in which said computer effects closed-loop feedback control.

* * * * *